(12) United States Patent
Hochschild

(10) Patent No.: US 6,867,722 B2
(45) Date of Patent: Mar. 15, 2005

(54) H-BRIDGE COMMON-MODE NOISE REDUCTION CIRCUIT

(75) Inventor: James R. Hochschild, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 63 days.

(21) Appl. No.: 10/383,962

(22) Filed: Mar. 7, 2003

(65) Prior Publication Data

US 2004/0160347 A1 Aug. 19, 2004

Related U.S. Application Data

(60) Provisional application No. 60/447,160, filed on Feb. 13, 2003.

(51) Int. Cl.[7] ............................................. H03M 3/00
(52) U.S. Cl. ..................................................... 341/146
(58) Field of Search .................................. 341/143, 155

(56) References Cited

FOREIGN PATENT DOCUMENTS

WO    WO 03/047309    *   6/2003

* cited by examiner

Primary Examiner—Jean Bruner Jeanglaude
(74) Attorney, Agent, or Firm—W. Daniel Swayze, Jr.; W. James Brady; Frederick J. Telecky, Jr.

(57) ABSTRACT

A common-mode noise reduction circuit (20) adapted to receive a DIN input (−1, 0, +1), such as from a sigma-delta modulator (12), and provide alternating outputs (DoutP, DoutM) such as to reduce the common-mode noise of an H-bridge (14). A zero detect circuit (26), a pattern generator (28) and a level generator circuit (24) provide that the outputs DoutP and DoutM are either both logic 1 or both logic 0, such as to lower the common-mode noise level by a device, such as a H-bridge (14). This circuitry (20) places a zero in the transfer function of the H-bridge (14) to reduce the common-mode noise, whereby high pass filters shape the noise out-of-band in an over sampled system.

11 Claims, 3 Drawing Sheets

US 6,867,722 B2

H-BRIDGE COMMON-MODE NOISE REDUCTION CIRCUIT

CROSS REFERENCE TO RELATED APPLICATIONS

This application claim priority from U.S. Provisional patent Application No. 60/447,160, fled on Feb. 13, 2003 and entitled Variable, Adaptive Quantization in Sigma-Delta Modulators. Cross reference is made to U.S. patent application Ser. No. 10/384,138, filed on Mar. 7, 2003 and U.S. application Ser. No. 10/384,262,filed on Mar. 7, 2003 and entitled Circuit For Modifying a Clock Signal To achieve a predetermined Duty Cycle.

FIELD OF THE INVENTION

The present invention is generally related to low-power coder/decoder (Codec) devices such as those used in the front end of a DSP, and more particularly to sigma-delta digital-to-analog converters (DACs) with 3-level outputs to an H-bridge.

BACKGROUND OF THE INVENTION

The demand for less expensive, lower power and more reliable integrated circuit components for use in communication, imaging and high-quality video applications continue to increase rapidly. Digital signal processors (DSPs) find wide use and acceptance in such applications, including in cell phones, PDAs, hearing aids, and many other devices including those processing audible sounds.

In DSP systems, analog signals are typically converted into a digital format for processing, and then these processed digital signals are converted back to analog signals. A codec device is often used at a front-end of a DSP, which integrates analog to digital and provides digital to analog conversions.

As shown in FIG. 1 at 10, a specific type of DAC, commonly known as a sigma-delta DAC shown at 12, is utilized to modulate input signals and provide a 3-level DIN output having outputs +1, 0, and −1. These DIN outputs may be provided to an H-bridge 14. The H-bridge 14 typically operates from voltage sources V+ and V−, and provides analog outputs Vout P and Vout M.

In conventional designs, the common-mode noise level at the output of the H-bridge is significant. The common-mode output in this conventional design is $((V+)+(V-))/2$ when the DIN is +1 or −1, and V− or V+ when DIN is 0, depending on which 0 state is chosen. This leads to a high, common-mode noise level at the output of the H-bridge.

There is desired circuitry to reduce common-mode noise levels at the output of an H-bridge, particularly when processing DIN inputs −1, 0, and +1 from a 3-level sigma-delta modulator.

SUMMARY OF THE INVENTION

The present invention achieves technical advantages as a processing circuit adapted to process DIN input −1, 0 and +1 from a sigma-delta modulator, and providing outputs effecting a greatly reduced common-mode noise level at the output of an H-bridge. The circuitry alternates the two 0 states, at the output thereof such that the average common-mode output of the H-bridge is $((V+)+(V-))/2$. By alternating the two 0 states, at least one zero (depending on the method of alternation) is placed at DC in the common-mode noise transfer function, wherein high pass filters shape the noise out-of-band in an over sampled system.

DETAILED DESCRIPTION OF THE PREFERRED EMBODIMENT

Figure 1:
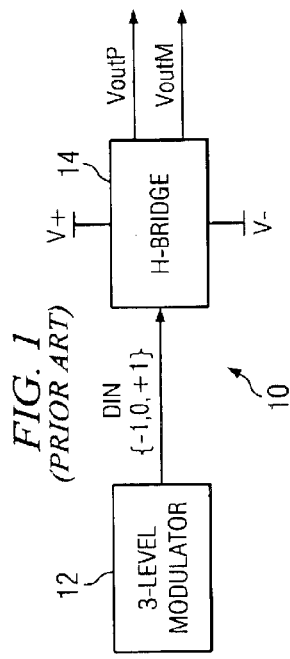
FIG. 1 is a block diagram representing a conventional H-bridge processing DIN inputs −1, 0, +1 from a 3-level sigma-delta modulator.
Figure 2:
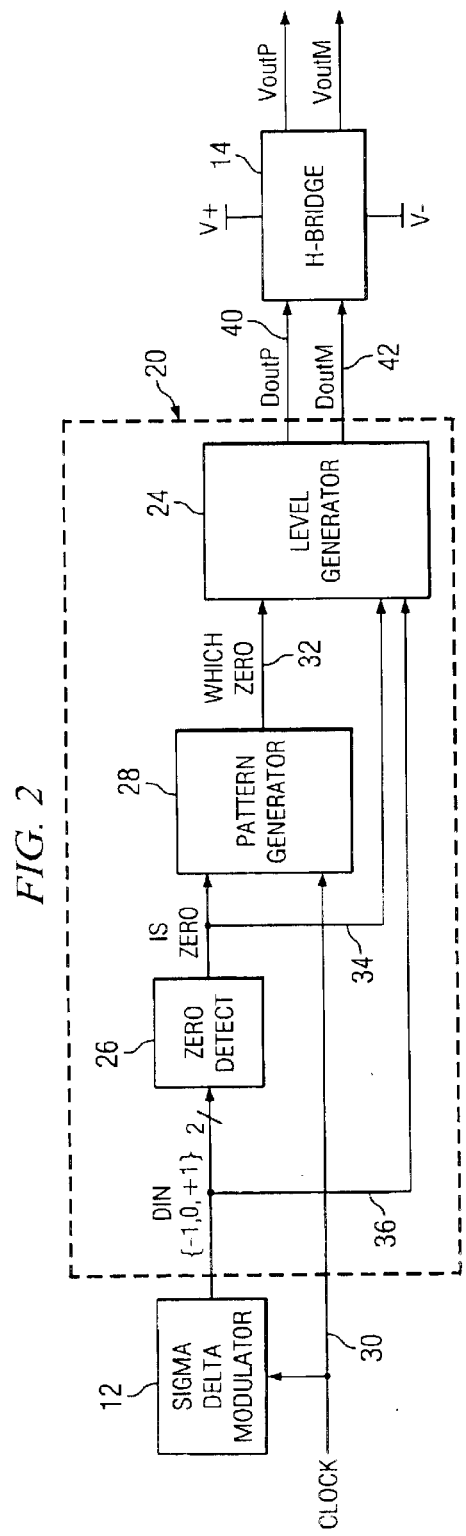
FIG. 2 is a block diagram of one preferred embodiment of the present invention whereby the circuitry processes the DIN inputs −1, 0, +1 from the sigma-delta modulator and provides varying outputs as a function when DIN 0 is detected.

Referring now to FIG. 2, there is shown at 20 a common-mode noise reduction circuit 20 according to a first preferred embodiment of the present invention. Circuit 20 is seen to be adapted to receive a 3-level signal from sigma-delta modulator 12, generating of DIN outputs (−1, 0, +1). Circuit 20 is further seen to include a level generator 24 providing digital outputs DoutP and DoutM to a conventional H-bridge 14. As will now be described in considerable detail, when a DIN 0 is detected by circuit 20, the outputs DoutP and DoutM are both established as either logic 1, or both logic 0 as provided to the H-bridge 14 to reduce the common-mode noise generated by the H-bridge when a DIN 0 is generated by the sigma-delta modulator 12.

As shown in FIG. 2, circuit 20 is seen to include a zero detect circuit 26 receiving the DIN inputs (−1, 0, +1) from sigma-delta modulator 12. This zero detect circuit 26 detects when the DIN 0 is received, and provides a signal indicative of this detection to a pattern generator 28. Typically, the sigma-delta modulator 12 has only two outputs, P OUT and N OUT, whereby a DIN 0 is represented by both outputs being logic 0. Zero detect circuitry 26 receives these two outputs and determines the DIN 0, and provides a signal indicative of same to the pattern generator 28.

Pattern generator 28 is responsively coupled to the zero detect circuit 26, and in response to the signal from zero detect circuit 26 generates an alternating output signal at 32 as a function of and in synchronization with a clock signal 30 provided thereto. The DIN outputs of sigma-delta modulator 12 are also provided to an input of the level generator 24 on line 36, as is the zero detect signal from zero detect circuit 26 provided on line 34. The various outputs of the level generator 24 is shown in Table 1 below:

TABLE 1

| | | Level Generator | | |
|---|---|---|---|---|
| Din | Is Zero | Which Zero | DoutP | DoutM |
| +1 | 0 | don't care | 1 | 0 |
| −1 | 0 | don't care | 0 | 1 |
| 0 | 1 | 0 | 0 | 0 |
| 0 | 1 | 1 | 1 | 1 |

As can be appreciated in Table 1, when the DIN output is +1, the digital output DoutP is a logic 1, and the digital output DoutM is logic 0. Conversely, if the DIN output is −1, the digital output DoutP and DoutM are logic 0 and logic 1, respectively. In both these cases, the DIN output is not 0, and the zero detect circuit 26 provides a logic 0 to the pattern generator 28.

The present invention achieves technical advantages in that when the DIN output is 0, as detected by zero detect circuit 26, a logic 1 output is provided to pattern generator 28. Responsive to the logic 1 output from zero detect circuit 26, pattern generator 28 in combination with level generator 24 provide that the digital outputs DoutP and DoutM, provided to output lines 40 and 42, respectively, alternate between both being a logic 0, and both being a logic 1, as shown in Table 1. The level of both digital outputs DoutP and DoutM is a function of the output provided by the pattern generator 28 on line 32, whereby the output signal provided on output line 32 alternates between a logic 0 and a logic 1 as a function of, and in synchronism with, the clock signal provided at input 30.

The present invention achieves technical advantages in that when a DIN 0 is provided to circuit 20, such as from a sigma-delta modulator 12, both digital outputs DoutP and DoutM at lines 40 and 42 are both the same, as provided to a conventional H-bridge 14, such that the common-mode noise from H-bridge 14 is significantly reduced. By alternating the input DoutP and DoutM to the H-bridge 14, the common-mode noise level at the H-bridge outputs VoutP and VoutP is such that the average common-mode output for the DIN 0 state is ((V+)+(V−))/2. This is because at least one zero, depending on the method of alternation, is placed at DC in the common-mode noise transfer function of the H-bridge 14, wherein when high pass filters (not shown) shape the noise of the H-bridge 14 to be out-of-band in an over sampled system.

Figure 3A:
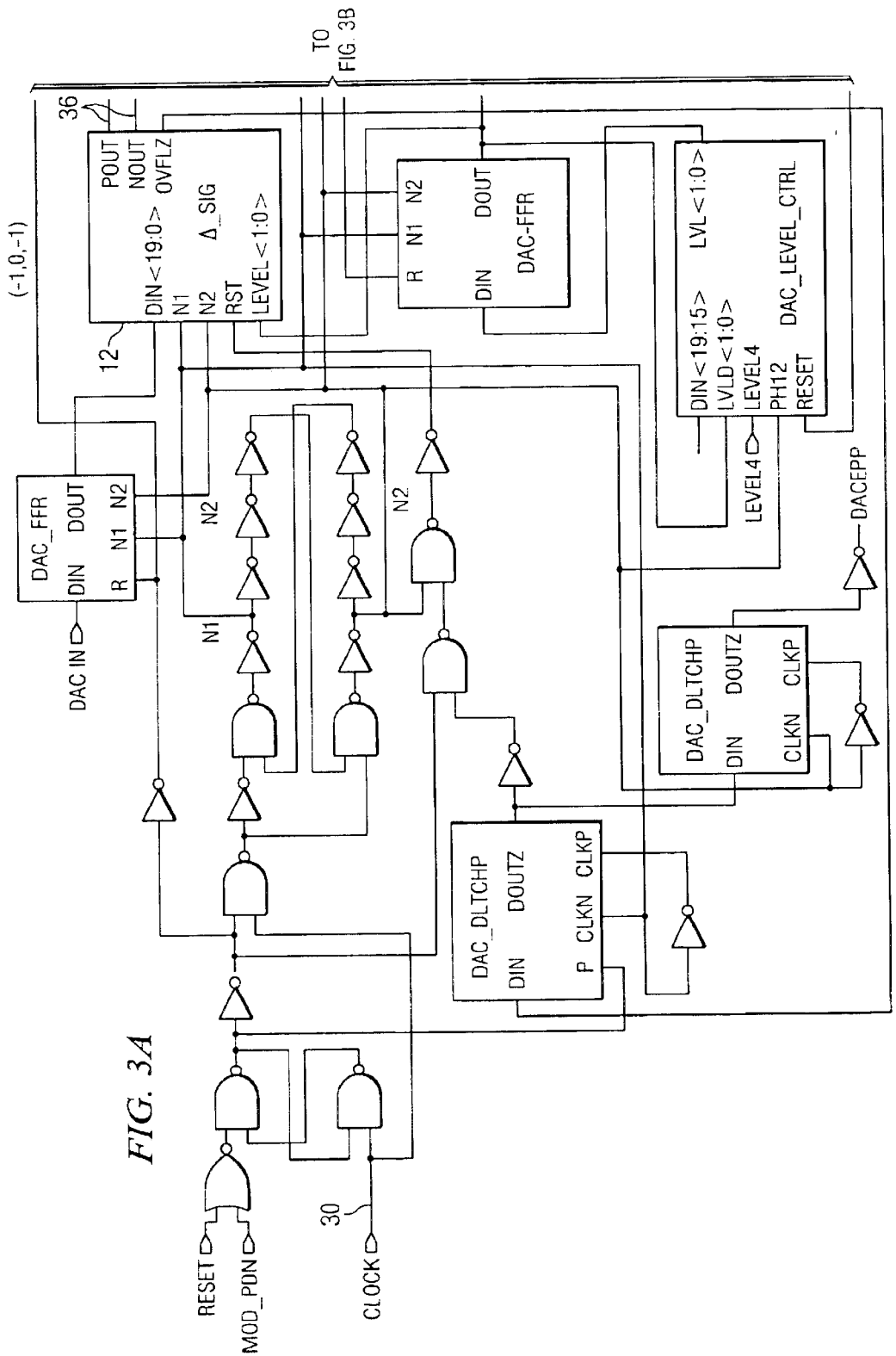
FIG. 3 is a detailed schematic of the embodiment depicted in FIG. 2 including circuitry operable to provide the varying outputs as a function of a detected 0.
Figure 3B:
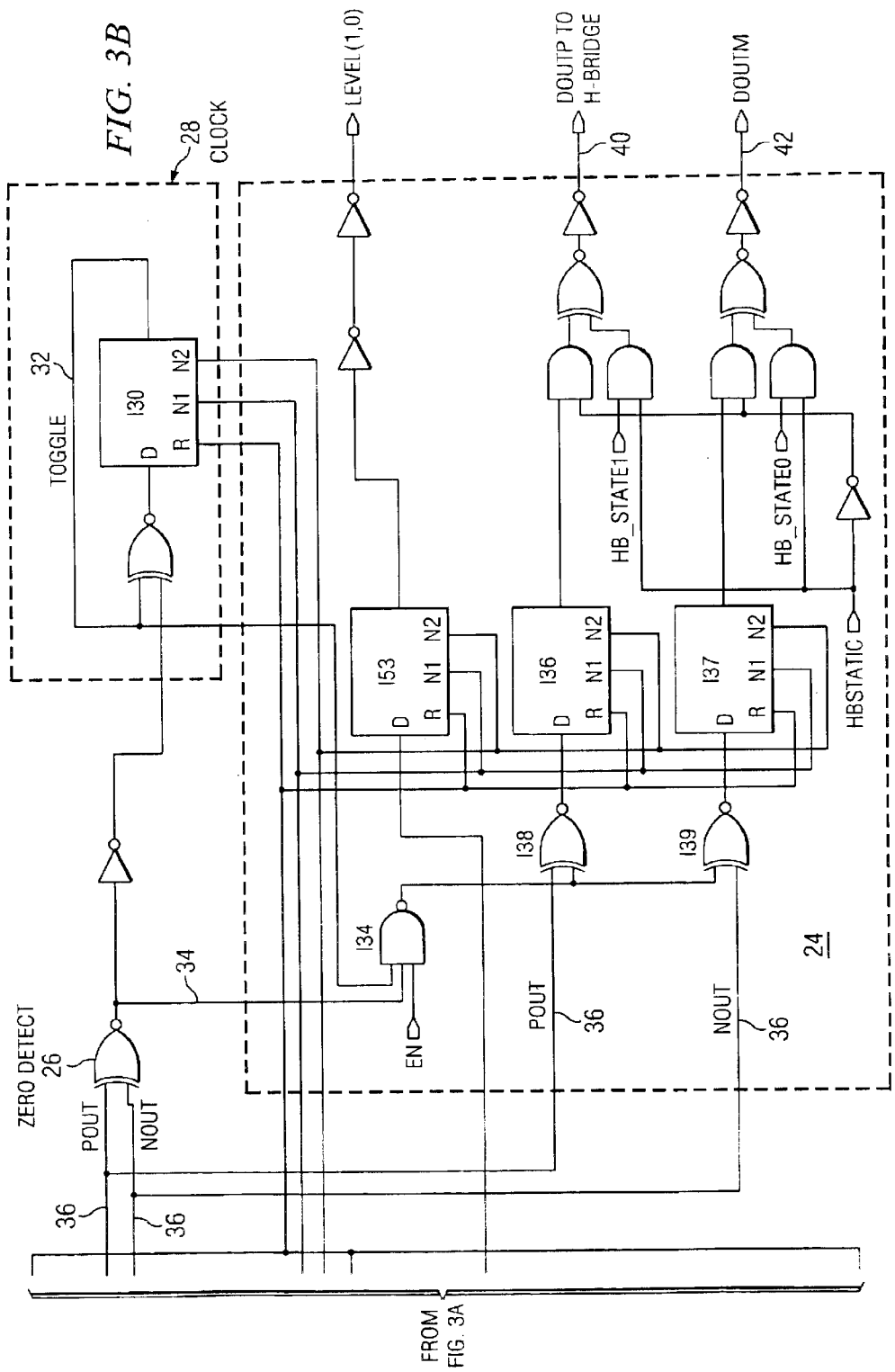

Referring now to FIG. 3, there is shown a detailed schematic of the common-mode noise reduction circuit 20, illustrating the zero detect circuit 26 being a 2 input NOR gate labeled 128 and receiving the inputs Pout and Nout from the sigma-delta modulator 12. When both outputs Pout and Nout of the sigma-delta modulator 12 are both logic 0, a logic 1 is provided at the output of NOR gate 128, which output is provided to the pattern generator 28. Pattern generator 28 is seen to comprise of an exclusive NOR gate (XNOR) 133 and a D flip-flop 130. As shown, the clock signal 30, comprising a two line clock provided to inputs N1 and N2 of D flip-flop circuit 130, determines the toggling of the output of D flip-flop 130 to line 32 as shown. This toggle output provided on line 32 is then fed to the input of the level generator 24, seen to comprise a 3 input NAND gate identified as 134. The first input to NAND gate 134 is an enable signal, the second input is received from the output of zero detect 128, and the third input is received from the toggle output 32 of pattern generator circuit 130.

Basically, the output levels of Pout and Nout from the sigma-delta modulator 12 are passed through to the outputs DoutP and DoutM on lines 40 and 42 when the sigma-delta modulator 12 provides a DIN output −1 and +1. Advantageously, when a DIN output 0 is generated by sigma-delta modulator 12, both outputs Pout and Mout of the sigma-delta modulator 12 cause zero detect circuit 26 to generate a logic 1, as provided to the second input of the level detect NAND gate 134, such that the output of the level detect NAND gate 134 alternates between a logic 0 and a logic 1 depending on the state of the toggle output 32 provided thereto from the pattern generator D flip-flop circuit 130. Thus, the output of the NAND gate 134 alternates its output which is provided to the respective input of exclusive NOR gates 138 and 139, which outputs feed respective D flip-flops 136 and 137. The clock signal 30 is provided to both of these D flip-flops 136 and 137 such that the output of both D flip-flops 136 and 137 are either both logic 1, or both logic 0 when a DIN 0 is processed by circuit 20.

Advantageously, the signal processing circuit 20 of the present invention provides two different types of 0 states when a DIN 0 is received. Specifically, both output DoutP and DoutM are either both logic 1, or both logic 0 for a given DIN 0. These two 0 states are utilized by an H-bridge to reduce the common-mode noise as discussed.

The present invention provides technical advantages in other circuits as well whereby two different levels are needed when a single input, such as a DIN 0, is received.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A signal processing circuit, comprising;
   an input adapted to receive DIN inputs (−1, 0, +1) from a modulator, the circuit operating from voltage sources V+ and V−, and having outputs OUT P and OUT M, whereby the outputs OUT P and OUT M alternate between each being logic 0 and logic 1 when the DIN input is 0, and
   a lever generator processing the DIN 0 to establish the levels of outputs OUT P and OUT M.

2. The circuit as specified in claim 1 further comprising a zero detect circuit detecting the DIN 0 and responsively generating a zero detect output.

3. The circuit as specified in claim 2 further comprising a pattern generator responsive to the zero detect output and generating the control signal.

4. The circuit as specified in claim 3 wherein the level generator is responsively coupled to the pattern generator.

5. The circuit as specified in claim 3 wherein the pattern generator toggles the control signal in response to a DIN 0 being received by the zero detect circuit.

6. A signal processing circuit, comprising;
   an input adapted to receive DIN inputs (−1, 0, +1) from a modulator, the circuit operating from voltage sources V+ and V−, and having outputs OUT P and OUT M, whereby the outputs OUT P and OUT M alternate between each being logic 0 and logic 1 when the DIN input is 0, and
   an H-bridge responsively coupled to the outputs OUT P and OUT M and having a transfer function, wherein the circuit provides a zero in the H-bridge transfer function.

7. A method of processing a 3-level DIN input (−1, 0, +1) from a modulator, comprising the steps of:
   receiving the DIN input (−1, 0, +1);
   processing the DIN INPUT (−1, 0, +1) and providing outputs OUT P and OUT M that vary when DIN 0 is receive, and
   providing outputs OUT P and OUT M to an H-bridge.

8. The method of processing as specified in claim 7 wherein the H-bridge has reduced common-mode noise as compared to not processing a varying OUT P and OUT M as a function of DIN 0.

9. The method of processing as specified in claim 8 further comprising the step of using a zero detect circuit to detect DIN 0.

10. The method of processing as specified in claim 7 further comprising the step of using a pattern generator to provide a toggled output in response to the zero.

11. The method of processing as specified in claim 10 further comprising the step of utilizing a level generator alternating the outputs OUT P and OUT M in response to the pattern generator toggled output.

* * * * *